United States Patent
Igarashi et al.

(10) Patent No.: US 7,768,132 B2
(45) Date of Patent: *Aug. 3, 2010

(54) CIRCUIT DEVICE AND MANUFACTURING METHOD THEREOF

(75) Inventors: Yusuke Igarashi, Gunma (JP); Takeshi Nakamura, Gunma (JP); Yasunori Inoue, Gifu (JP); Ryosuke Usul, Aichi (JP); Hideki Mizuhara, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 175 days.

This patent is subject to a terminal disclaimer.

(21) Appl. No.: 11/165,680

(22) Filed: Jun. 24, 2005

(65) Prior Publication Data
US 2006/0001166 A1   Jan. 5, 2006

(30) Foreign Application Priority Data
Jun. 30, 2004  (JP) .......................... P2004-193290

(51) Int. Cl.
*H01L 23/48*  (2006.01)
*H01L 23/52*  (2006.01)
*H01L 29/40*  (2006.01)
*H01L 23/04*  (2006.01)
*H01L 23/10*  (2006.01)
*H01L 23/34*  (2006.01)

(52) U.S. Cl. .................. 257/774; 257/698; 257/706; 257/713; 257/724; 257/775; 257/E23.011; 257/E23.021; 257/E23.101; 257/E23.145; 257/E23.161; 257/E23.174; 257/E23.175; 438/126; 438/613; 438/652; 438/667; 438/668

(58) Field of Classification Search .................. None
See application file for complete search history.

(56) References Cited

U.S. PATENT DOCUMENTS

| 4,372,804 A | 2/1983 | Hanabusa et al. |
| 6,010,768 A | 1/2000 | Yasue et al. |
| 6,429,509 B1 * | 8/2002 | Hsuan .................. 257/690 |

(Continued)

FOREIGN PATENT DOCUMENTS

CN  1491076  4/2004

(Continued)

OTHER PUBLICATIONS

Office action in U.S. Appl. No. 11/138,932, filed Sep. 20, 2007.

*Primary Examiner*—Andy Huynh
*Assistant Examiner*—Hoang-Quan T Ho
(74) *Attorney, Agent, or Firm*—Fish & Richardson P.C.

(57) ABSTRACT

A circuit device including a multilayer wiring structure having an improved heat radiation performance, and a manufacturing method thereof is provided. A circuit device of the invention includes a first wiring layer and a second wiring layer laminated while interposing a first insulating layer. The first wiring layer is connected to the second wiring layer in a desired position through a connecting portion formed so as to penetrate the first insulating layer. The connecting portion includes a first connecting portion protruding in a thickness direction from the first wiring layer, and a second connecting portion protruding in the thickness direction from the second wiring layer. The first connecting portion and the second connecting portion contact each other at an intermediate portion in the thickness direction of the insulating layer.

8 Claims, 15 Drawing Sheets

U.S. PATENT DOCUMENTS

| | | | |
|---|---|---|---|
| 6,822,316 B1* | 11/2004 | Hsuan | 257/621 |
| 6,912,779 B2 | 7/2005 | Naitoh et al. | |
| 7,186,921 B2* | 3/2007 | Igarashi et al. | 174/255 |
| 7,315,083 B2* | 1/2008 | Igarashi et al. | 257/758 |
| 2002/0052062 A1* | 5/2002 | Sakamoto et al. | 438/110 |
| 2002/0074667 A1* | 6/2002 | Chinda et al. | 257/774 |
| 2003/0080409 A1* | 5/2003 | Nakamura et al. | 257/700 |
| 2003/0160325 A1* | 8/2003 | Yoneda et al. | 257/758 |
| 2004/0060174 A1* | 4/2004 | Imafuji et al. | 29/831 |
| 2004/0224499 A1* | 11/2004 | Yoneda et al. | 438/640 |
| 2004/0226744 A1* | 11/2004 | Asahi et al. | 174/262 |
| 2004/0262644 A1* | 12/2004 | Naruse et al. | 257/226 |
| 2005/0263320 A1* | 12/2005 | Igarashi et al. | 174/255 |
| 2005/0263905 A1 | 12/2005 | Usul et al. | |

FOREIGN PATENT DOCUMENTS

| | | |
|---|---|---|
| JP | 06-177295 | 6/1994 |
| JP | 08-330356 | 12/1996 |
| JP | 2001-339151 | 12/2001 |

* cited by examiner

CIRCUIT DEVICE AND MANUFACTURING METHOD THEREOF

BACKGROUND OF THE INVENTION

Priority is claimed to Japanese Patent Application Number JP2004-193290 filed on Jun. 30, 2004, the disclosure of which is incorporated herein by reference in its entirety.

1. Field of the Invention

The present invention relates to a circuit device and a manufacturing method thereof, more specifically, to a circuit device including a plurality of wiring layers laminated while interposing an insulating layer, and a manufacturing method thereof 2. Background Art A configuration of conventional circuit device 100 will be described with reference to FIG. 15. This technology is described for instance in Japanese Patent Publication No. 2001-339151 (p. 1, FIG. 1). FIG. 15 is a cross-sectional view of the conventional circuit device 100.

In the conventional circuit device 100, first conductive pattern 102A is formed on a surface of support substrate 101 and second conductive pattern 102B is formed on a rear surface of the support substrate 101. Moreover, semiconductor element 104 and chip element 106 are fixed onto the first conductive pattern 102A, and the semiconductor element 104 is electrically connected to the first conductive pattern 102A by use of metal thin lines 105. Meanwhile, the first conductive pattern 102A and the elements connected thereto are sealed with sealing resin 103.

In addition, the first conductive pattern 102A formed on the front surface of the support substrate 101 and the second conductive pattern 102B formed on the rear surface of the support substrate 101 are electrically connected to each other through contact holes 108. These contact holes 108 are formed by burying a conductive material into holes, which are formed by penetrating the support substrate 101.

However, the circuit device 100 applies a substrate made of an organic material such as epoxy resin as the circuit substrate 101. The substrate made of the organic material has been applied in light of workability upon formation of the contact holes 108. However, the organic substrate such as a glass epoxy substrate has low thermal conductivity, and therefore has a problem that the substrate cannot discharge heat generated by the embedded elements efficiently to the outside. Moreover, there is also a problem that formation of the contact holes 108 is complicated when resin containing a large amount of inorganic filler is applied as the material of the support substrate 101 in order to enhance a heat radiation performance of the support substrate 101.

SUMMARY OF THE INVENTION

The present invention has been made in consideration of the foregoing problems. The present invention provides a circuit device that includes a multilayer wiring structure with an enhanced heat radiation performance, and a manufacturing method thereof A circuit device of the present invention includes a first wiring layer and a second wiring layer laminated while interposing an insulating layer, a first connecting portion formed continuously from the first wiring layer and buried in the insulating layer, a second connecting portion formed continuously from the second wiring layer and buried in the insulating layer, and a circuit element electrically connected to the second wiring layer. Here, the first connecting portion and the second connecting portion contact each other in a space in a thickness direction of the insulating layer.

A method of manufacturing a circuit device of the present invention includes the steps of forming a first connecting portion protruding in a thickness direction on a surface of a first conductive film, laminating a second conductive film so as to cover the first connecting portion while interposing an insulating layer containing filler which is formed on the surface of the first conductive film, removing the second conductive film in a region corresponding to the first connecting portion, forming a via hole by removing the insulating layer in a region thinly formed by burying the first connecting portion and thereby exposing an upper surface of the first connecting portion at a bottom surface of the via hole, connecting the first conductive film and the second conductive film by forming a second connecting portion made of a plated film in the via hole, forming a first wiring layer and a second wiring layer by patterning the first conductive film and the second conductive film, and mounting a circuit element on any of the first wiring layer and the second wiring layer.

According to the circuit device of the present invention, the first wiring layer is provided with the first connecting portion and the second wiring layer is provided with the second connecting portion. Moreover, the first connecting portion and the second connecting portion contact each other at an intermediate portion in the thickness direction of the insulating layer on which the first wiring layer and the second wiring layer are laminated. Therefore, it is possible to enhance reliability of the connecting portions against external force such as heat stress. Further, it is possible to enhance mechanical strength of the connecting portions by forming any of the first connecting portion and the second connecting portion integrally with the wiring layer by processing a copper foil.

According to the method of manufacturing a circuit device of the present invention, it is possible to form the via hole of the insulating layer by providing the though hole on the insulating layer which is thinly formed by burying the first connecting portion. Moreover, it is possible to reduce a planar size of the though hole thus formed. Furthermore, the plated film can be formed in the via hole easily because it is possible to form the shallow via hole.

DESCRIPTION OF THE PREFERRED EMBODIMENTS

First Embodiment

Figure 1A:
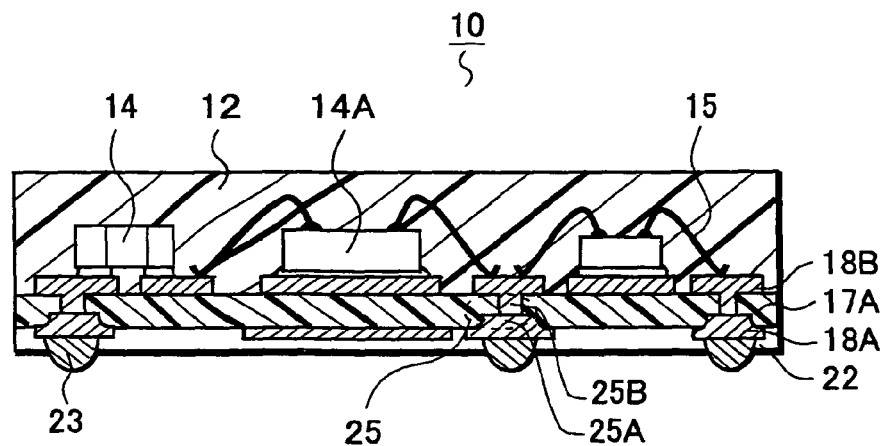
FIGS. 1A and 1B are cross-sectional views showing a circuit device of a preferred embodiment of the invention.
Figure 1B:
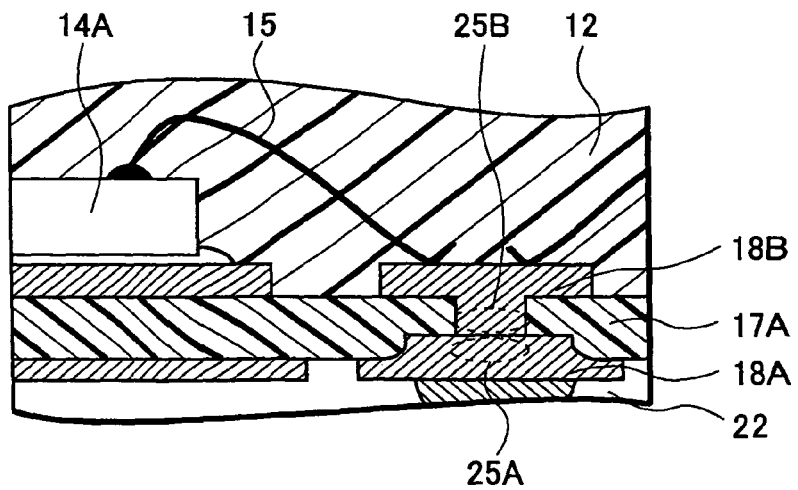

Circuit device 10 will be described with reference to FIGS. 1A and 1B. FIG. 1A is a cross-sectional view of the circuit device 10, and FIG. 1B is an enlarged cross-sectional view of connecting portion 25 of the circuit device 10 and the vicinity thereof.

A multilayer wiring structure including first wiring layer 18A and second wiring layer 18B is formed in the circuit device 10 of this embodiment. The second wiring layer 18B is laminated on the first wiring layer 18A while interposing first insulating layer 17A therebetween. The second wiring layer 18B which is an upper layer is electrically connected to circuit elements 14. External electrodes 23 are formed on a rear surface of the first wiring layer 18A located as a lower layer. Moreover, the circuit elements 14 and the second wiring layer 18B are covered with sealing resin 12. The circuit device 10 having the above-described schematic configuration will be described below in detail.

The first wiring layer 18A is made of metal such as copper, and is patterned on a rear surface of the first insulating layer 17A as the lowermost wiring layer. This first wiring layer 18A is electrically connected to the second wiring layer 18B of the upper layer through connecting portions 25. Moreover, the first wiring layer 18A may function as a pad for forming the external electrodes 23 thereon. Furthermore, the first wiring layer 18A per se may be used as an external electrode or may constitute a wiring portion intersecting with the second wiring layer 18B of the upper layer. This wiring portion may constitute rewiring for connecting the pad to the connecting portion 25. Meanwhile, it is also possible to form wiring for connecting the embedded circuit elements.

The second wiring layer 18B is the upper wiring layer which is formed on a surface of the first insulating layer 17A. The second wiring layer 18B forms lands on which the circuit elements 14 are placed, pads to be connected to electrodes on the circuit elements 14, and a wiring portion for electrically connecting these pads. Moreover, the second wiring layer 18B and the first wiring layer 18A can be formed to intersect planarly with each other. Therefore, even when semiconductor element 14A has numerous electrodes, it is possible to form a cross-over configuration and to draw a pattern freely by use of the multilayer wiring structure of this embodiment. This second wiring layer 18B is connected to the first wiring layer 18A in desired positions through the connecting portions 25. Naturally, it is also possible to increase the number of layers of the wiring layers to three layers, four layers, five layers, and so on depending on the number of electrodes of the semiconductor element, mounting density of the elements, and the like.

The first insulating layer 17A is formed between the first wiring layer 18A and the second wiring layer 18B described above, and is configured to insulate the both layers from each other. As the material of the first insulating layer 17A, it is possible to apply resin containing organic or inorganic filler in order to enhance a heat radiation performance. The inorganic filler may be preferably a metal oxide having high thermal conductivity, such as a Si oxide or alumina. Moreover, the filler mixed therein may be prepared by blending a wide range of grain sizes from several micrometers to several tens of micrometers. In this way, it is possible to fill the filler densely. Alternatively, it is also possible to fill the filler densely by applying spherical filler grains.

Moreover, it is also possible to form the first insulating layer 17A with multiple resin layers having mutually different filler compositions. For example, it is possible to form the first insulating layer 17A with a lower resin layer containing a large amount of the filler and an upper resin layer containing a smaller amount of the filler. Alternatively, it is possible to mix multiple types of the filler having different compositions into the first insulating layer 17A.

The connecting portion 25 is a region penetrating the first insulating layer 17A and electrically connecting the first wiring layer 18A to the second wiring layer 18B. In this embodiment, the connecting portion 25 includes a first connecting portion 25A continuously extending from the first wiring layer 18A, and a second connecting portion 25B continuously extending from the second wiring layer 18B. Further details of the connecting portion 25 will be described later with reference to FIG. 1B.

The circuit elements 14 are fixed onto the second wiring layer 18B, and the circuit elements 14 and the wiring layers collectively constitute a predetermined electric circuit. An active element such as a transistor, a diode, an IC or a system LSI, and a passive element such as a capacitor or a resistor are applied as the circuit element 14.

The semiconductor element 14A is a semiconductor element including several tens to several hundreds of pads on a surface thereof. Further, it is also possible to apply a so-called system LSI as the semiconductor element 14A. Here, the system LSI is a large-scale element having an analog operation circuit, a digital operation circuit, a storage unit or the like and configured to achieve a system function with a single LSI. Therefore, as compared to a conventional LSI, the system LSI is operated while generating a larger amount of heat.

Moreover, when a rear surface of the semiconductor element 14A is connected to ground potential, the rear surface of the semiconductor element 14A is fixed by use of a brazing member, conductive paste or the like. On the contrary, when the rear surface of the semiconductor element 14A is floating, the rear surface of the semiconductor element 14A is fixed by use of an insulative adhesive. Here, when the semiconductor element 14A is mounted in a face-down fashion, the semiconductor element 14A is mounted by use of bump electrodes made of solder or the like.

Further, a power system transistor for controlling a large current, such as a power metal oxide semiconductor (MOS), a grounded-trench-MOS assisted bipolar-mode field effect transistor (GTBT), an insulated gate bipolar transistor (IGBT) or a thyristor is also applicable as the semiconductor element 14A. In addition, a power system IC is also applicable as the semiconductor element 14A.

The sealing resin 12 is formed either by transfer molding applying thermosetting resin or by injection molding applying thermoplastic resin, for example. Here, the sealing resin 12 is formed so as to seal the electric circuit including the second wiring layer 18B, the semiconductor element 14A, and the circuit elements 14. Moreover, as the sealing method other than molding, it is also possible to apply publicly known sealing methods such as sealing by potting or sealing by use of a casing.

The external electrode 23 is made of a brazing member such as solder. The external electrodes 23 are formed in predetermined positions on the rear surface of the first wiring layer 18A and function as connector fixing the circuit device 10 to a mounting substrate. Further, the external electrodes 23 also have a function to exchange electric signals with the outside and a function to discharge the heat to the outside.

Next, details of the connecting portion 25 will be described with reference to the cross-sectional view in FIG. 1B. The connecting portion 25 is the region configured to connect the laminated wiring layers to each other while penetrating the insulating layer. Moreover, it is also possible to use the connecting portion 25 as a thermal via hole for thermally coupling the wiring layers.

In this embodiment, the connecting portion 25 is formed of the first connecting portion 25A and the second connecting portion 25B. The first connecting portion 25A is the region protruding in the thickness direction continuously from the first wiring layer 18A. Here, the first connecting portion 25A protrudes upward and is buried in the first insulating layer 17A. The second connecting portion 25B is the region protruding in the thickness direction continuously from the second wiring layer 18B. Here, the second connecting portion 25B protrudes downward and is buried in the first insulating layer 17A.

The first connecting portion 25A is the region formed so as to protrude in the thickness direction by an etching process, which is made of a Cu foil formed by a plating process or a rolling process. Moreover, it is also possible to form the first connecting portion 25A by a method other than the etching process. To be more precise, the first connecting portion 25A can be formed by forming either an electrolytic plating film or an electroless plating film into a convex shape on the surface of the first wiring layer 18A. Alternatively, the first connecting portion 25A can be also formed by providing either a brazing material such as solder or a conductive material such as silver paste on the surface of the first wiring layer 18A.

The second connecting portion 25B is the region formed by a plating process such as electrolytic plating or electroless plating. The method of forming this second connecting portion 25B will be described later in an embodiment for describing a manufacturing method. Further, it is also possible to form the second connecting portion 25B in accordance with a method similar to the above-described method of forming the first connecting portion 25A.

In this embodiment, a position of contact of the first connecting portion 25A and the second connecting portion 25B described above is located at an intermediate portion in the thickness direction of the first insulating layer 17A. Here, the intermediate portion means a position located above an upper surface of the first wiring layer 18A and below a lower surface of the second wiring layer 18B. Therefore, although the position of contact of the first connecting portion 25A and the second connecting portion 25B is located in the vicinity of a central portion in the thickness direction of the first insulating layer 17A in the drawing, this position may be changed within the above-described range of the intermediate portion. Considering that the second connecting portion 25B is formed by the plating process, it is favorable to locate the position of contact of the first connecting portion 25A and the second connecting portion 25B in a position above the middle position between the upper surface of the first wiring layer 18A and the lower surface of the second wiring layer 18B. In this way, there is an advantage of easier formation of the second connecting portion 25B which is made of the plated film. That is, as will be clarified in the manufacturing method to be described later, a via hole is formed in order to form the second connecting portion 25B and it is possible to form a shallow via hole in this process. As the shallow via hole is formed, it is also possible to reduce a via diameter. Moreover, as the via diameter is reduced, it is also possible to reduce spaces between the via holes. In this way, it is possible to realize a fine pattern on the whole.

Figure 2A:
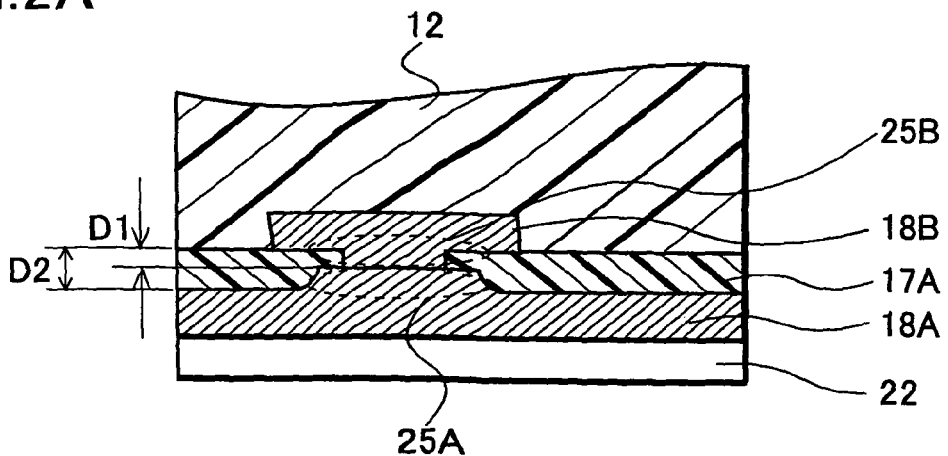
FIG. 2A is a cross-sectional view showing the circuit device of the preferred embodiment of the invention.
Figure 2B:
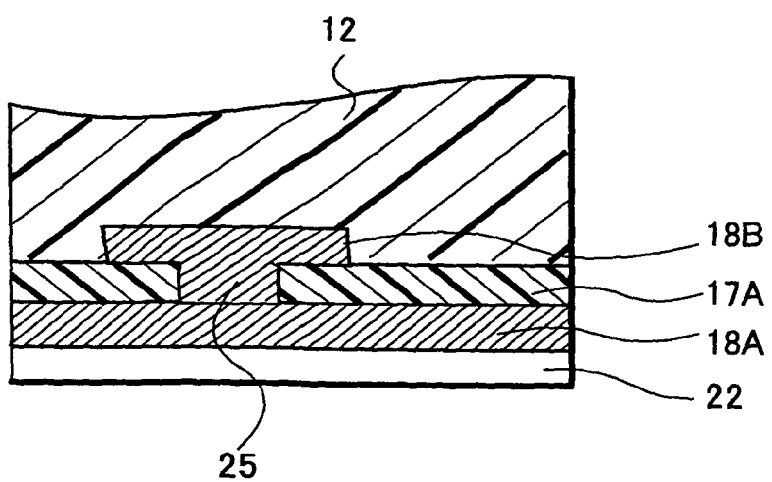
FIGS. 2B and 2C are cross-sectional views showing comparative examples.
Figure 2C:
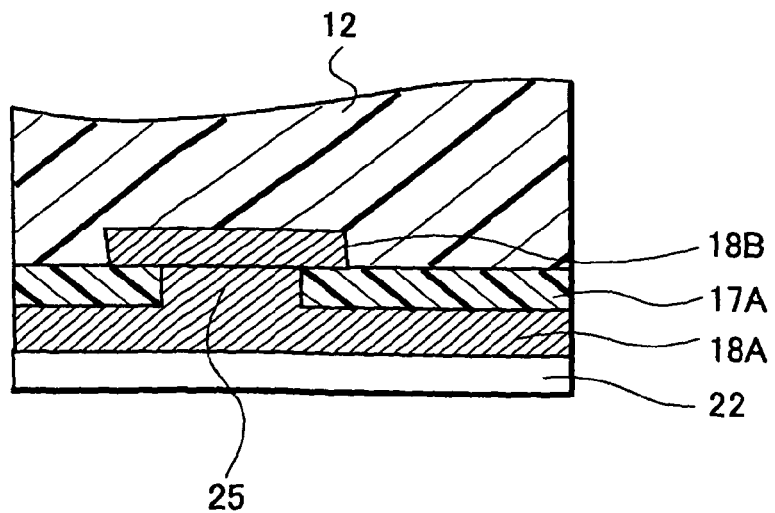

An advantage of the configuration of the connecting portion 25 will be described with reference to respective cross-sectional views of FIGS. 2A to 2C. FIG. 2A is a view showing a cross-sectional shape of the connecting portion 25 of this embodiment, and FIGS. 2B and 2C are cross-sectional views showing comparative examples relevant to this embodiment.

The structure of the connecting portion 25 of this embodiment will be described further in detail with reference to FIG. 2A. Firstly, solder resist 22 is provided on the lowermost layer, and the first wiring layer 18A is patterned on a surface of the solder resist 22. Then, the second wiring layer 18B is laminated thereon while interposing the first insulating layer 17A. Meanwhile, the entire region of the second wiring layer 18B is covered with the sealing resin 12 for sealing the whole.

As described previously, the connecting portion 25 includes the first connecting portion 25A and the second connecting portion 25B. Moreover, the position of contact of the both connecting portions is located at the intermediate portion in the thickness direction of the first insulating layer 17A. A thickness (D2) of a portion of the first insulating layer 17A covering the first wiring layer 18A is approximately equal to 35 µm, for example. Meanwhile, a distance (D1) between the position of contact of the first connecting portion 25A and the second connecting portion 25B, and, the upper surface of the first insulating layer 17A is approximately equal to 15 µm, for example. In this configuration, it is possible to enhance reliability of the connecting portion 25 against external force such as heat stress.

The heat stress will now be described. This heat stress is assumed to be increased on interfaces between the respective members. To be more precise, the first wiring layer 18A, the first insulating layer 17A, and the sealing resin 12 have mutually different thermal expansion coefficients. Although both of the sealing resin 12 and the first insulating layer 17A are mainly made of resin, the thermal expansion coefficients are slightly different due to a difference in the amount of the inorganic filler mixed therein, for example. For this reason, stress occurs on the interface between the sealing resin 12 and the first insulating layer 17 and on the interface between the first insulating layer 17A and the first wiring layer 18A due to a temperature change attributable to a condition of use. A typical example of such a phenomenon is a slip between the layers. Therefore, in the configuration of this embodiment, the position of contact of the first connecting portion 25A and the second connecting portion 25B is located at the intermediate portion of the first insulating layer 17A. This configuration can contribute to prevention of the slip and enhance reliability of the connecting portion 25 against the heat stress.

A first comparative example will now be described with reference to FIG. 2B. Here, the connecting portion 25 is formed integrally with the second wiring layer 18B which is the upper layer. Moreover, a tip portion of the connecting portion 25 buried in the first insulating layer 17A contacts the surface of the first wiring layer 18A. In this comparative example, the connecting portion 25 contacts a plane where the interface between the first wiring layer 18A and the first insulating layer 17A is located. Accordingly, it is conceivable that there is a large influence (such as a slip) of the heat stress occurring on the interface to the position of contact of the connecting portion 25. Therefore, the configuration of the first comparative example has less reliability against the heat stress as compared to the configuration of this embodiment.

A second comparative example will now be described with reference to FIG. 2C. Here, the connecting portion 25 is formed integrally with the first wiring layer 18A which is the lower layer. Moreover, an upper end of the connecting portion 25 contacts the lower surface of the second wiring layer 18B. As described previously, it is conceivable that large heat stress also occurs on the interface between the first insulating layer 17A and the sealing resin 12. Accordingly, the heat stress acts on a portion of contact between the connecting portion 25 and the second wiring layer 18B. Therefore, reliability of contact between the both members is deemed low. Comparing the above described first comparative example and the second comparative example with the embodiment of the invention, high reliability of the connecting portion 25 of this embodiment against the heat stress is confirmed.

For example, when shifting force is applied in vertical direction to the drawings, the connecting portions in FIG. 2B and FIG. 2C may slip due to certain force. On the contrary, according to the structure of this embodiment shown in FIG. 2A, the position of contact is located in the insulating layer 17A. Therefore, in spite of an attempt of a slip between the first wiring layer and the second wiring layer, the position of contact hardly slips as the connecting portion breaks into the insulating layer 17A.

Figure 3A:
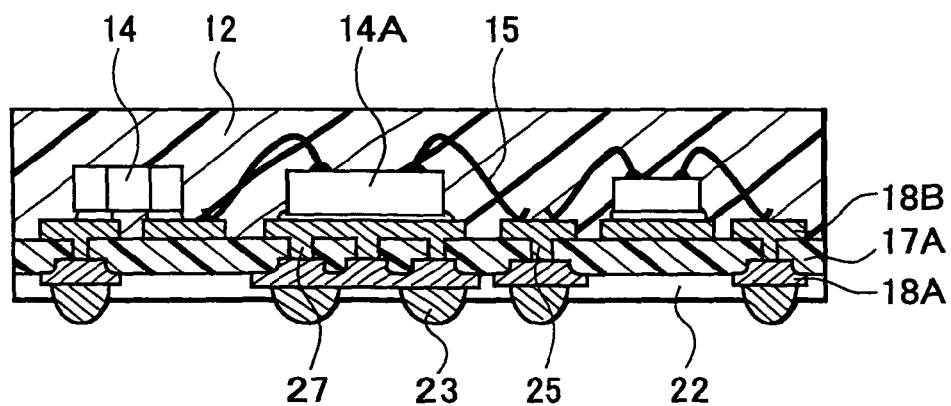
FIGS. 3A and 3B are cross-sectional views showing another circuit device of the preferred embodiment of the invention.
Figure 3B:
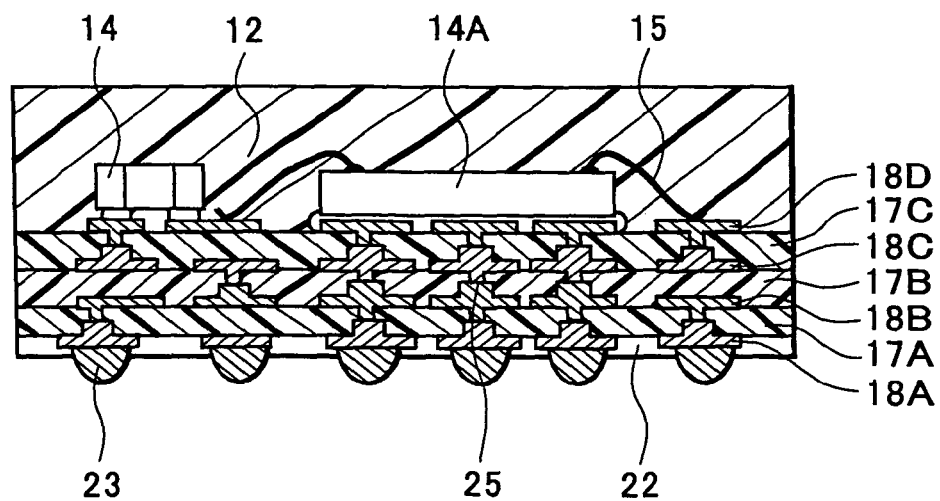

A configuration of a circuit device according to another embodiment will be described with reference to FIGS. 3A and 3B. FIGS. 3A and 3B are cross-sectional view of the circuit device according to another embodiment.

As shown in FIG. 3A, thermal via holes 27 are formed herein so as to penetrate the first insulating layer 17A. The thermal via hole 27 is a region formed by filling metal in a hole penetrating the first insulating layer 17A, which functions as a heat path to the outside. Therefore, the thermal via holes 27 do not have to function as electrical passages. To be more precise, the thermal via holes 27 are formed so as to contact the lower surface of the second wiring layer 18B of the land shapes to which the semiconductor element 14A is fixed. Therefore, even when a large amount of heat is generated by the semiconductor element 14A, the heat is transmitted to the outside through the plurality of thermal via holes 27. The heat path in this case is in the order of the semiconductor element 14A, the second wiring layer 18B, the thermal via holes 27, the external electrodes 23, and the outside. Here, each of the thermal via holes 27 also includes the first connecting portion 25A and the second connecting portion 25B described above. Moreover, the portion of contact of the first connecting portion 25A and the second connecting portion 25B is located at the intermediate portion in the thickness direction of the insulating layer. The thermal via holes 27 function as the heat path, which is the region predicted to be susceptible to the large heat stress. Accordingly, the configuration of this embodiment is meaningful.

As shown in FIG. 3B, a four-layer wiring structure is formed herein by laminating wiring layers while interposing insulating layers. To be more precise, the first wiring layer 18A is formed on the lower surface of the first insulating layer 17A. The second wiring layer 18B is formed on the upper surface of the first insulating layer 17A. Likewise, second wiring layer 18B, third wiring layer 18C, and fourth wiring layer 18D are laminated while interposing the first insulating layer 17A, second insulating layer 17B, and third insulating layer 17C. Accordingly, it is possible to enhance wiring density by increasing the number of the wiring layers. Connecting portions are formed on the first insulating layer 17A to the third insulating layer 17C so as to connect the respective wiring layers. Here, the external electrodes 23 are formed in predetermined positions on the first wiring layer 18A. Moreover, it is also possible to use the external electrodes 23 formed immediately below the semiconductor element 14A solely for enhancing the heat radiation performance.

Figure 4A:
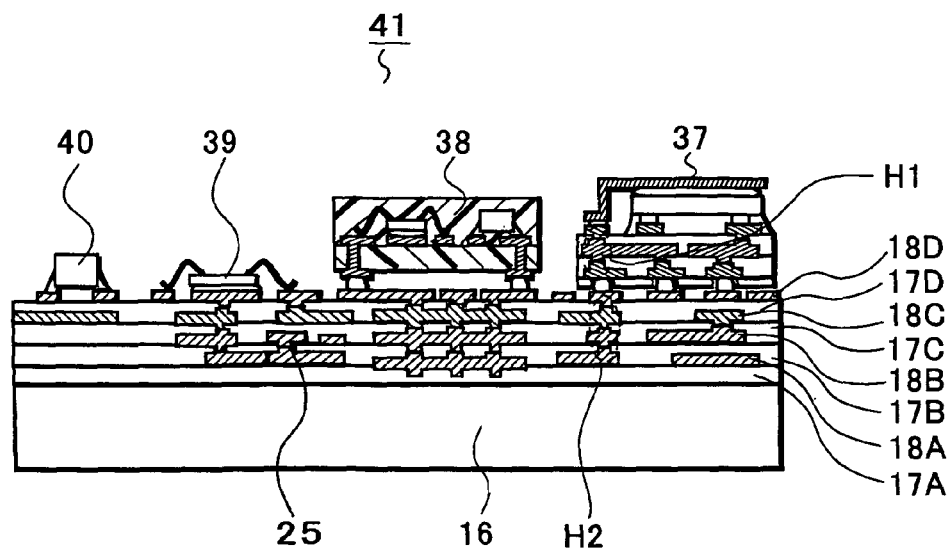
FIGS. 4A and 4B are cross-sectional views showing still another circuit device of the preferred embodiment of the invention.
Figure 4B:
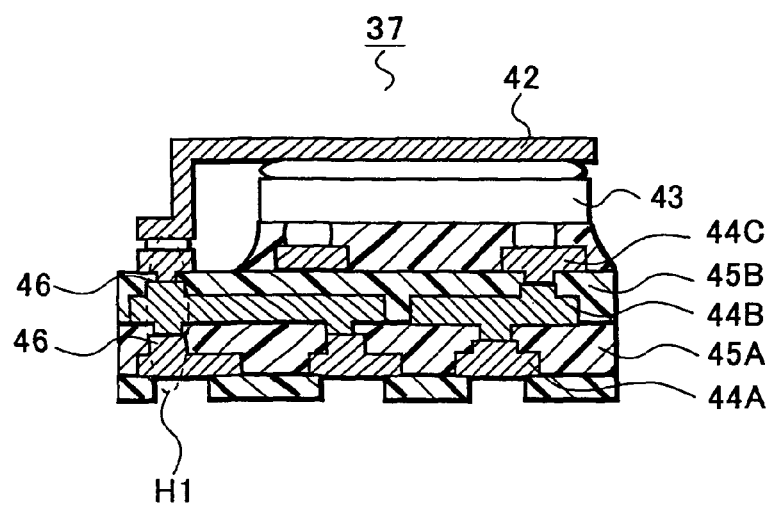

A configuration of circuit module 41 according to still another embodiment will be described with reference to FIGS. 4A and 4B. FIG. 4A is a cross-sectional view showing the configuration of the circuit module 41, and FIG. 4B is a cross-sectional view of first circuit device 37 constituting part of the circuit module 41.

As shown in FIG. 4A, a multilayer wiring structure is formed on a surface of circuit substrate 16. The four-layer wiring structure including first wiring layer 18A to fourth wiring layer 18D are formed herein. A plurality of circuit elements are mounted on the uppermost fourth wiring layer 18D. Here, two circuit devices are fixed. In addition, first circuit element 39 which is a bare transistor chip and second circuit element 40 are mounted on the uppermost fourth wiring layer 18D.

The first circuit device 37 is a circuit device including one semiconductor chip, in which multilayer wiring is formed on a support substrate. The detailed structure of the first circuit device 37 will be described later with reference to FIG. 4B. Meanwhile, the second circuit device 38 is a system in package (SIP) in which a system is constructed by incorporating a semiconductor element and a passive element therein. Although the package realized by planarly disposing the circuit elements is illustrated herein, it is also possible to apply a stack structure. As for the circuit element to be incorporated in the first circuit device 37 or the second circuit device 38, it is possible to adopt an active element or a passive element in general as similar to the circuit element described with reference to FIG. 1A. Moreover, as for the first circuit element 39 or the second circuit element 40 to be directly fixed to the fourth wiring layer 18D, it is also possible to adopt an active element or a passive element in general as similar to the circuit element described with reference to FIG. 1A.

Details of the first circuit device 37 will be described with reference to FIG. 4B. In the first circuit device 37, the semiconductor element is flip-chip mounted on a substrate formed into multiple layers.

Here, a multilayer wiring structure is formed by use of first wiring layer 44A, second wiring layer 44B, and third wiring layer 44C. Therefore, even when semiconductor element 43 is an LSI element including numerous pads, it is possible to draw wiring out of the pads. Moreover, the semiconductor element 43 is the flip-chip mounted LSI element, which is fixed to the third wiring layer 44C through a brazing member such as solder.

One side of connecting plate 42 is fixed to a rear surface (which is an upper surface in the drawing) of the semiconductor element 43 by use of an adhesive. Moreover, the other side of the connecting plate 42 fixed to the third wiring layer 44C. This connecting plate 42 functions as a path for discharging the heat generated by the semiconductor element 43. Therefore, the heat generated by the semiconductor element 43 is transmitted to the third wiring layer 44C through the connecting plate 42. Further, the third wiring layer 44C connecting the connecting plate 42 is connected to the second wiring layer 44B and the first connecting layer 44A therebelow through connecting portions 46. Therefore, path H1 for transmitting the heat in the thickness direction of the substrate is formed by these connecting portions 46. This path H1 is a region which functions as a heat path while not allowing transmission of electric signals. Meanwhile, when the rear surface of the semiconductor element 43 is connected to ground potential, this path also functions as a path to be connected to the ground potential. For example, in the case of a power MOS or a bipolar transistor, the rear surface of the chip constitutes a current path. Accordingly, the connecting plate is fixed by use of a brazing member or conductive paste, whereby thermal and electrical connection is realized.

In addition, as shown in FIG. 4A, the first wiring layer 44A (see FIG. 4B) located at the bottom of the path H1 is connected to the fourth wiring layer 18D laminated on the surface of the circuit substrate 16 through a brazing member. Moreover, path H2 including the respective wiring layers connected by connecting portion 25 is formed below the path H1. The path H2 is a path for transmitting the heat generated by the first circuit device 37 to the circuit substrate 16. According to the configuration described above, the heat generated by the semiconductor element incorporated in the first circuit device 37 is transmitted to the circuit substrate 16 through the first path H1 formed inside the first circuit device 37 and the second path H2 formed on the surface of the circuit substrate 16. Thereafter, the heat is discharged to the outside. Accordingly, the circuit module 41 has a structure with an excellent heat radiation performance. In addition, it is possible to further enhance the heat radiation performance by applying a ceramic substrate or a metal substrate to the circuit substrate.

Second Embodiment

In this embodiment, a manufacturing method will be explained while taking the above-described circuit device 10 as an example. It is to be noted, however, that the following manufacturing method of this embodiment is also applicable to methods of manufacturing the circuit devices of other types.

Figure 5A:
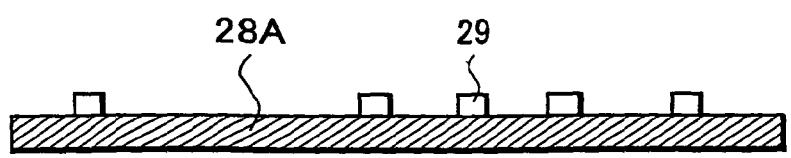
FIGS. 5A to 5C are cross-sectional views showing a method of manufacturing a circuit device of a preferred embodiment of the invention.

Firstly, first conductive film 28A is prepared as shown in FIG. 5A. As the first conductive film 28A, it is possible to apply a material containing copper as a main component and a material containing Fe—Ni or Al as a main component. In terms of a thickness of the first conductive film 28A, it is required to provide a thickness equal to or above a sum of the thickness of the wiring layer 18A expected to be formed and a height of first connecting portion 25A. To be more precise, the thickness of the first conductive film 28A is set in a range from about 20 µm to 150 µm. Resist 29 covers a surface of the first conductive film 28A in regions where the first connecting portions 25A are expected to be formed. Etching is performed in a state of covering with the resist 29.

Figure 5B:
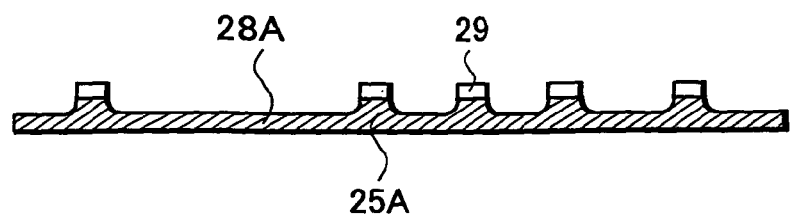

A cross section in a state after etching is shown in FIG. 5B. Here, the regions covered with the resist 29 protrude in convex shapes. The first connecting portions 25A are formed of these regions protruding in the convex shapes. Moreover, the thickness of regions of the first conductive film 28A where surfaces were exposed upon etching is uniformly reduced. The resist 29 is peeled off after completing this process. Here, the height of protrusion of the first connecting portions 25A is adjusted to several tens of micrometers.

Figure 5C:
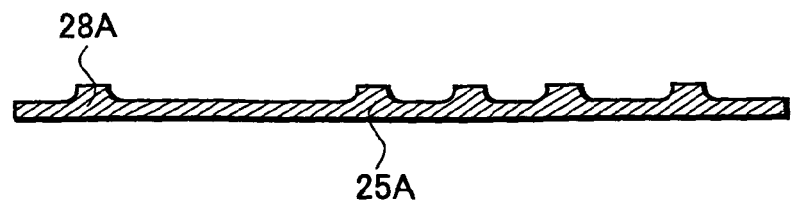

The first connecting portions 25A after peeling the resist 29 off are shown in FIG. 5C. Each of the above-described first connecting portions 25A is formed into a larger cross section as compared to cross sections of the first connecting film 28A in other regions. Therefore, this portion has a superior heat radiation performance as compared to other regions.

Next, another method of forming the first connecting portions 25A on the surface of the first conductive film 28A will be described with reference to FIGS. 6A to 6C. Here, the first connecting portions 25A are formed by depositing a plated film selectively on the surface of the first conductive film 28A.

Figure 6A:
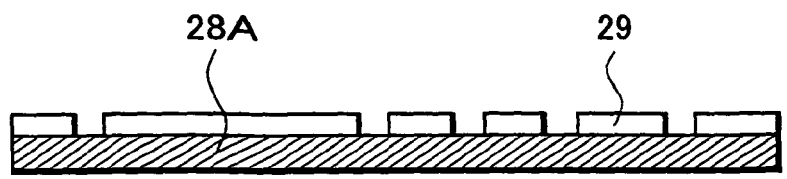
FIGS. 6A to 6C are cross-sectional views showing the method of manufacturing a circuit device of the preferred embodiment of the invention.

Firstly, the resist 29 is selectively formed on a surface of the first conductive film 28A as shown in FIG. 6A. To be more precise, the resist 29 is formed so as to exclude regions where the first connecting portions 25A are expected to be formed.

Figure 6B:
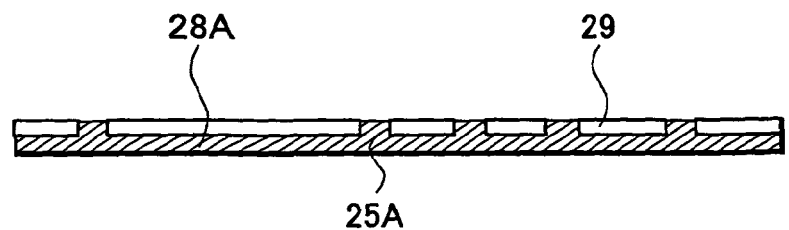
Figure 6C:
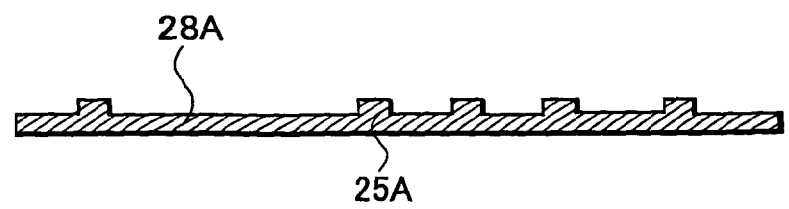

Next, as shown in FIG. 6B, the plated film is deposited on the surface of the first conductive film 28A selectively exposed out of the resist 29. Deposition of this plated film may be performed by applying an electrolytic plating process, an electroless plating process, or a method of combination of these two processes. The first connecting portions 25A of the convex shapes as shown in FIG. 6C are obtained by peeling the resist 29 off after completing this process.

Figure 7A:
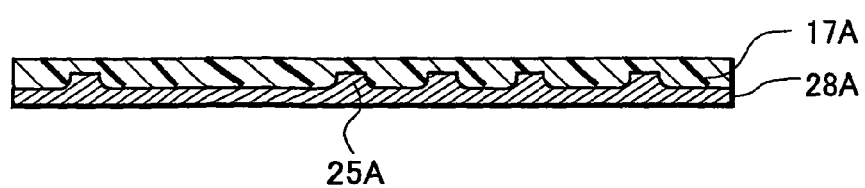
FIGS. 7A and 7B are cross-sectional views showing the method of manufacturing a circuit device of the preferred embodiment of the invention.

A conductive foil located as a lower layer in FIG. 7A is realized by any of the two methods described above. Next, first insulating layer 17A is laminated on the surface of the first conductive film 28A so as to cover the first connecting portions 25A including upper surfaces thereof. Here, a large amount of inorganic filler may be mixed in this first insulating layer 17A in order to enhance the heat radiation performance. To be more precise, the content of the inorganic filler may reach nearly 80% by mass, for example. In this case, mobility of the resin may be low. Here, the resin may be supplied in multiple batches upon formation of the first insulating layer 17A.

Figure 7B:
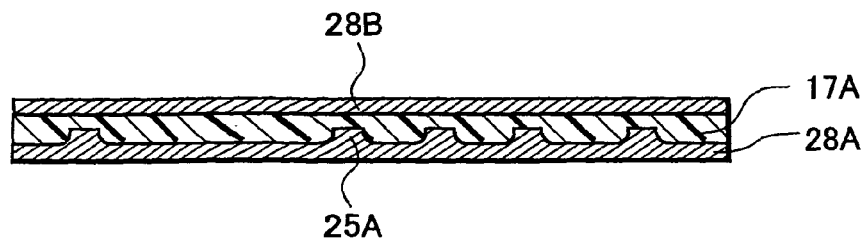

Moreover, second conductive film 28B is laminated on a surface of the first insulating layer 17A as shown in FIG. 7B. Here, the first insulating layer 17A and the second conductive film 28B are individually laminated. However, it is also possible to attach the first insulating layer 17A to a rear surface of the second conductive film 28B and to laminate the second conductive film 28B on the first conductive film 28A. In this process, side surfaces of the first connecting portions 25A are tapered. In this way, there is an advantage that it is easier to bury the first connecting portions 25A into the first insulating layer 17A.

Next, a method of forming via holes 32 will be described with reference to FIGS. 8A to 8D. Here, the via holes 32 are formed by partially removing the second conductive film 28B and the first insulating layer 17A located above the first connecting portions 25A.

Figure 8A:
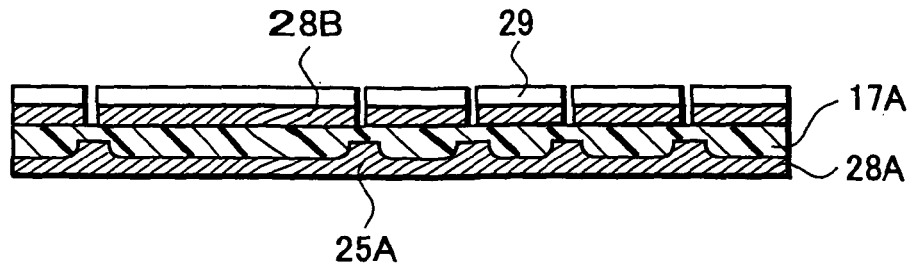
FIGS. 8A to 8D are cross-sectional views showing the method of manufacturing a circuit device of the preferred embodiment of the invention.

Firstly, the regions where the via holes are expected to be formed are exposed as shown in FIG. 8A, and then a surface of the second conductive film 28B is covered with the resist 29. Then, the second conductive film 28B exposed from the resist 29 is removed by etching. The resist 29 is peeled off after this etching process.

Figure 8B:
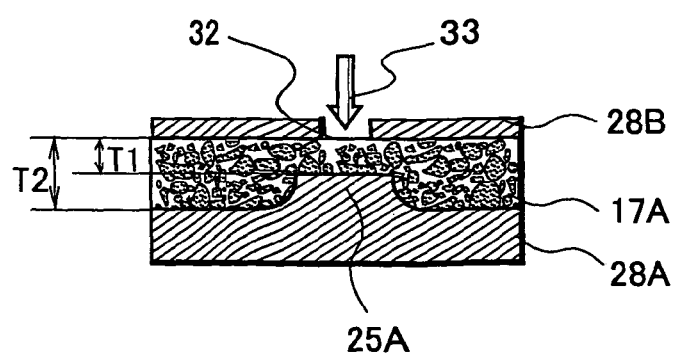

A cross section after the etching process is shown in FIG. 8B. The second conductive film 28B located above the first connecting portions 25A is removed by the etching process, and the via holes 32 are thereby formed. Moreover, the first insulating layer 17A is partially exposed out of bottoms of the via holes 32. Then, the first connecting portions 25A are exposed out of lower portions of the via holes 32 by irradiating laser 33 while using the second conductive film 28B as a mask.

Figure 8C:
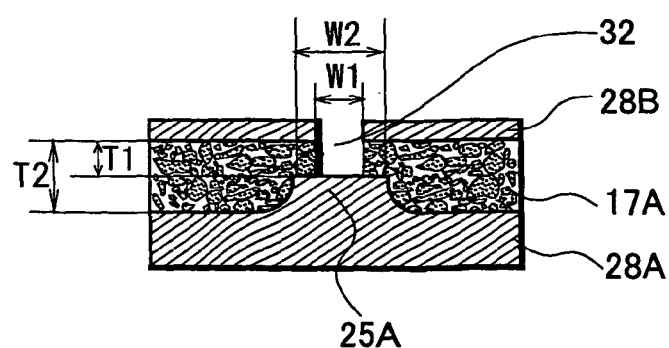

The method of forming the via holes 32 will be described further in detail with reference to FIG. 8C. In this embodiment, the first insulating layer 17A below the via holes 32 becomes thinner by burying the first connecting portions 25A. Moreover, the first connecting portions 25A are exposed out of the lower portions of the via holes 32 by removing the thin regions of the first insulating layer 17A by use of the laser. In the majority of these regions, thickness T2 of the first insulating layer 17A is approximately equal to 50 μm, for example. On the contrary, thickness T1 of the first insulating layer 17A in the regions corresponding to the lower portions of the via holes 32 is rendered thin in a range from about 10 μm to 25 μm, for example. Here, it is possible to reduce a time period for opening the via holes 32 by use of the laser because of the thin first insulating layer 17A on the first connecting portions 25A.

The planar size of each of the first connecting portions 25A is formed larger than the size of the via hole 32 to be formed thereon. In other words, since the planar shapes of the via hole 32 and the first connecting portion 25A are circular, the diameter of the first connecting portion 25A is formed larger than the diameter of the via hole 32. For example, when diameter W1 of the via hole 32 is approximately equal to 100 μm, diameter W2 of the first connecting portion 25A is adjusted to a range from about 150 μm to 200 μm. Meanwhile, when the diameter W1 of the via hole 32 is in a range from about 30 μm to 50 μm, diameter W2 of the first connecting portion 25A is adjusted to a range from about 50 μm to 70 μm. In this way, by forming the planar size of the first connecting portion 25A larger than the size of the via hole 32, it is possible to locate the via hole 32 above the first connecting portion 25A even if the via hole 32 slightly deviates upon formation. Therefore, it is possible to avoid a decrease in connection reliability attributable to such deviation. Here, as the planar shape of the first connecting portion 25A, it is also possible to apply shapes other than the circular shape such as a rectangular shape.

Figure 8D:
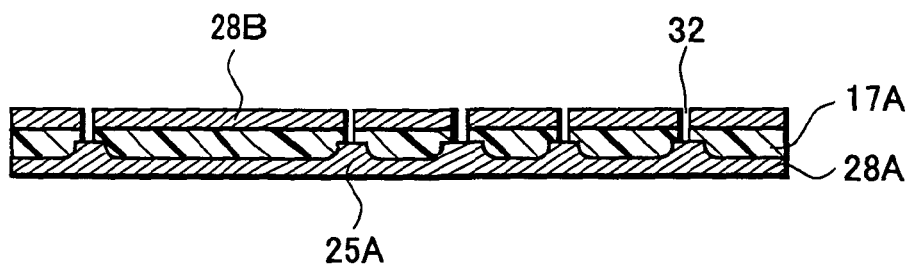

A cross section after forming the via holes 32 in accordance with the above-described method is shown in FIG. 8D. The upper surfaces of the first connecting portions 25A are exposed out of lower surfaces of the respective via holes 32. Moreover, the filler contained in the first insulating layer 17A is exposed out of side walls of the via holes 32 formed by the laser process. The filler is represented by $Al_2O_3$, AlN, and the like. Here, when residue remains at the bottoms of the via holes 32 by above-described laser process, a cleaning process is carried out for removing this residue.

Figure 9A:
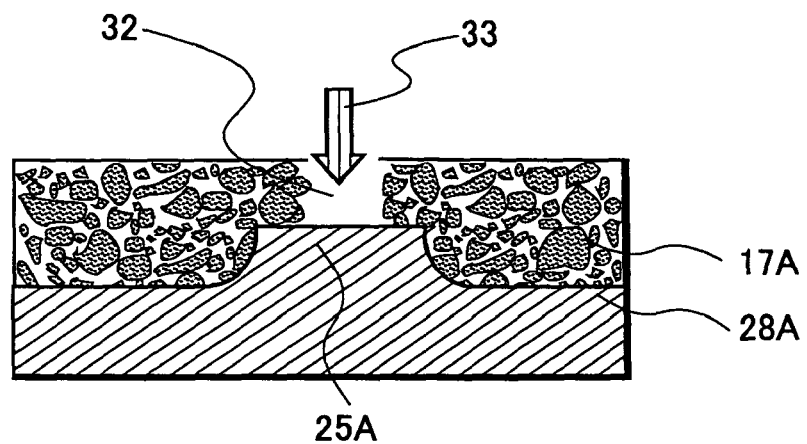
FIGS. 9A and 9B are cross-sectional views showing the method of manufacturing a circuit device of the preferred embodiment of the invention.

Another method of forming the via holes 32 will be described with reference to FIGS. 9A and 9B.

The other method of forming the via holes 32 by use of a laser will be described with reference to FIG. 9A. In the above description, the via holes 32 are formed after covering the first insulating layer 17A with the second conductive film 28B. However, it is also possible to form the via holes 32 according to the other method. To be more precise, it is possible to expose the upper surfaces of the first connecting portions 25A out of the lower portions of the via holes 32 by removing the first insulating layer 17A before covering with the second conductive film 28B.

When the size of the via hole 32 is equal to or below 10 μm, it is conceived that a carbon dioxide laser cannot blow the resin due to its wavelength. A YAG laser is a possible alternative; however, the YAG laser may blow Cu away. Therefore, it is possible to form the via hole 32 by blowing the insulative resin directly with the YAG laser without providing the second conductive film 28B. An abrasion depth is shallower than a spot diameter of the laser. Accordingly, it is possible to reduce the abrasion depth by providing the first connecting portion 25A. In this way, it is possible to reduce a pulse number.

Figure 9B:
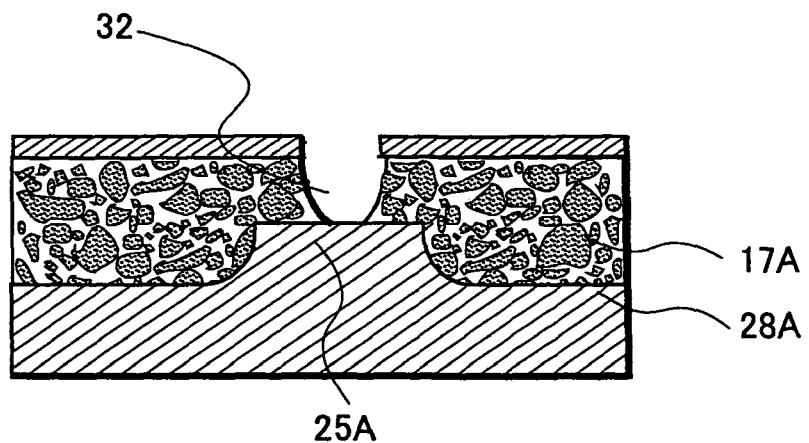

It is also possible to perform isotropic wet etching instead of the laser as shown in FIG. 9B. As is generally known, the height of the first connecting portion 25A, i.e. the thickness of the first insulating layer 17A has an influence on a bore diameter. Accordingly, the possibility to reduce the thickness of the first insulating layer 17A has an advantage to reduce the bore diameter. Obviously, it is also possible to realize the via holes 32 by dry etching based on the publicly known semiconductor technology. In this case, it is possible to reduce an etching time period due to a small opening depth.

Thereafter, a zincate process is performed prior to performing a plating process as a subsequent process. The zincate process is a process for attaching Zn to a region expected to form a plated film by use of an alkaline solution containing Zn ions. To be more precise, there is a portion on the side wall of the via hole 32 where the inorganic filler is exposed. Moreover, when a large amount of the filler is mixed in the first insulating layer 17A, a major part of the side wall of the via hole 32 is formed into the surface where the filler is exposed. It is difficult to form an electroless plating film having sufficient adhesion and other characteristics on surfaces of the inorganic filler such as a ceramic. Accordingly, in this embodiment, a metal film made of Zn is formed on the surface of the via hole 32 where the inorganic filler is exposed and then the plated film is formed by a substitution reaction to Zn. Therefore, adhesion strength between the side wall of the via hole 32 and plated film 34 is strengthened.

Next, a process of forming second connecting portion 25B by forming a plated film in the via hole 32 and thereby connecting the first conductive film 28A to the second conductive film 28B will be described with reference to FIG. 10A to FIG. 11C. There are two conceivable methods for forming this plated film. The first method is a method of forming the plated film by electroless plating and then forming another plated film by electrolytic plating. The second method is a method of forming the plated film only by an electrolytic plating process.

Figure 10A:
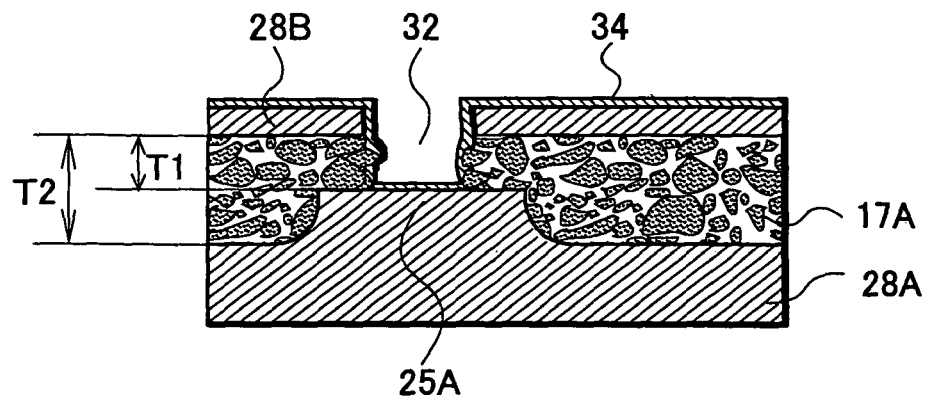
FIGS. 10A to 10C are cross-sectional views showing the method of manufacturing a circuit device of the preferred embodiment of the invention.

The first method of forming the plated film will be described with reference to FIGS. 10A to 10C. Firstly, as shown in FIG. 10A, the plated film 34 is formed on the surface of the second conductive film 28B including the side wall of the via hole 32 by the electroless plating process. A thickness in a range from about 3 μm to 5 μm is sufficient for this plated film 34.

Figure 10B:
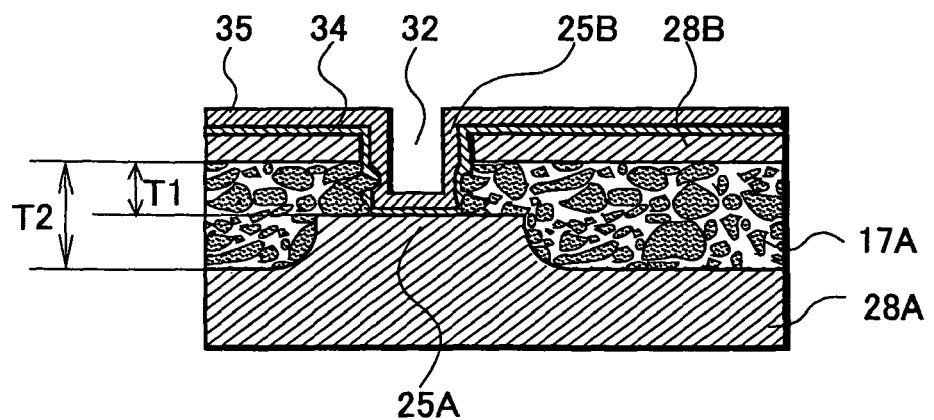

Next as shown in FIG. 10B, new plated film 35 is formed on an upper surface of the plated film 34 by the electrolytic plating process. To be more precise, the plated film 35 is formed by the electrolytic plating process while using the second conductive film 28B formed with the plated film 34 as a cathode electrode. The plated film 34 is formed on an inner wall of the via hole 32 by the above-described electroless plating method. Therefore, the plated film 35 to be formed herein is formed into a uniform thickness including the inner wall of the via hole 32. In this way, the second connecting portion 25B made of the plated film is formed. The concrete thickness of the plated film 35 is set to about 20 μm, for example. As the materials of the plated film 34 and the plated film 35 described above, it is possible to apply copper which is the same material as the second conductive film 28B. Here, it is also possible to apply metal other than copper as the materials of the plated film 34 and the plated film 35.

Figure 10C:
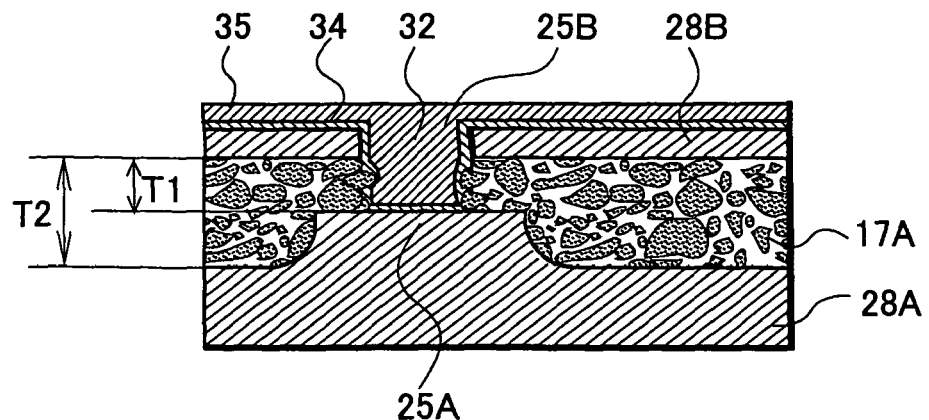

As shown in FIG. 10C, the via hole 32 is buried with the plated film 35 by execution of filling plating. By execution of filling plating, it is possible to enhance mechanical strength of the second connecting portion 25B.

Next, the second method of forming the second connecting portion 25B by use of the electrolytic plating method will be described with reference to FIGS. 11A to 11C.

Figure 11A:
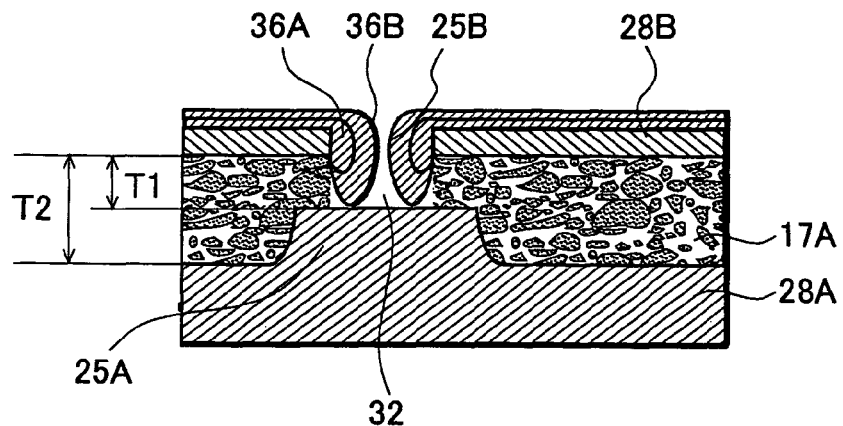
FIGS. 11A to 11C are cross-sectional views showing the method of manufacturing a circuit device of the preferred embodiment of the invention.
Figure 11B:
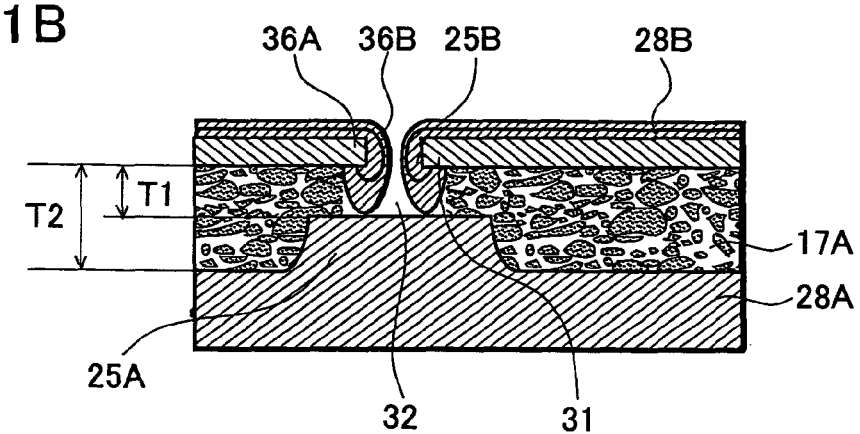
Figure 11C:
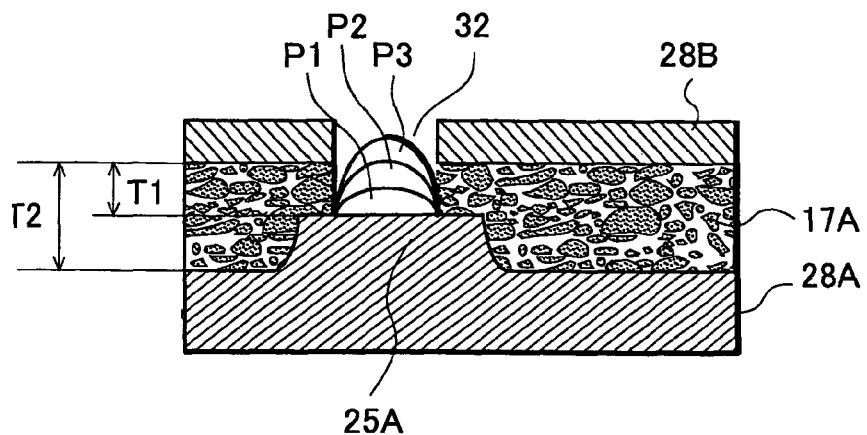

Firstly, as shown in FIG. 11A, a solution containing metal ions is allowed to contact the second conductive film 28B and the via hole 32. Here, copper, gold, silver, palladium, and the like are applicable as the material of the plated film. Then, by applying an electric current while using the second conductive film 28B as a cathode electrode, the metal is deposited on the second conductive film 28B as the cathode electrode, and the plated film is thereby formed. Here, aspects of growth of the plated film are indicated with reference numerals 36A and 36B. In the electrolytic plating method, the plated film is formed preferentially in a portion having a stronger electric field. In this embodiment, this electric field becomes strong at a portion of the second conductive film 28B facing a peripheral portion of the via hole 32. Therefore, as shown in the drawing, the plated film is deposited preferentially from the portion of the second conductive film 28B facing the peripheral portion of the via hole 32. When the plated film thus formed contacts the first connecting portion 25A, the first conductive film 28A is connected to the second conductive film 28B. Thereafter, the plated film is formed uniformly inside the via hole 32. In this way, the second connecting portion 25B integrated with the second conductive film 28B is formed inside the via hole 32.

Next, another method of forming the second connecting portion 25B will be described with reference to FIG. 11B. Here, the second connecting portion 25B is easily formed in accordance with the electrolytic plating method by providing eaves 13 at the peripheral portion of the via hole 32. Here, the "eaves" mean regions formed of the second conductive film 28B overhanging so as to cover the peripheral portions of the via hole 32. To be more precise, the eaves can be manufactured by increasing an output of a laser when forming the via hole 32 with the laser. By increasing the output of the laser, removal of the insulating layer 17A by the laser progresses in a lateral direction. Accordingly, the resin in regions below the eaves 13 is removed. By performing the electrolytic plating process while using the second conductive film 28B as a cathode electrode under the aforementioned conditions, the plated film grows preferentially from the portions of the eaves 13. As the plated film grows from the eaves 13, it is possible to allow the plated film grow preferentially in a downward direction as compared to the case illustrated in FIG. 11A. Therefore, it is possible to bury the via hole 32 with the plated film reliably.

Next, still another method of forming the second connecting portion 25B will be described with reference to FIG. 11C. Here, the second connecting portion 25B is formed by performing the electrolytic plating process while using the first conductive film 28A as a cathode electrode. Here, aspects of growth of the plated film are indicated with reference codes P1, P2, and P3. As described previously, the plated film is formed preferentially in the position having the stronger electric field in the electrolytic plating method. Therefore, the plated film is formed from the upper surface of the first connecting portions 25A. The progress of formation of the plated film is in the order of P1, P2 and P3, and the second connecting portion 25B is completely formed by electrically connecting the plated film to the second conductive film 28B. In contrast to the case shown in FIG. 11A and FIG. 11B, it is possible to deposit the plated film from the bottom. Therefore, it is possible to bury the via hole 32 with the plated film reliably. Moreover, in this method, an amount of increase in the thickness of the second conductive film 28B by adhesion of the plated film is very small. Accordingly, it is possible to retain the thin condition of the second conductive film 28B.

The side wall of the via hole 32 of this embodiment is formed into an irregular shape. Moreover, the inorganic filler mixed in the first insulating film 17A is exposed on the side wall of the via hole 32. For these reasons, it is difficult to form the plated film on the side wall of the via hole 32. In general, it is difficult to adhere the plated films to the surface of the filler which is an inorganic material. Particularly, it is difficult to form the plated film when AlN is exposed on the side wall of the via hole 32. Accordingly, in this embodiment, the second connecting portion 25B is formed by use of the above-described electrolytic plating method.

Moreover, in this embodiment, by forming the plated film in the via hole 32, the plated film is also formed inevitably on the surface of the second conductive film 28B in a considerable thickness. However, in this embodiment, the plated film is formed in the shallow via hole 32 having a depth of about 10 μm as described above. Therefore, it is possible to reduce the total thickness of the plated film thus formed. Accordingly, the amount of increase in the thickness of the second conductive film 28B attributable to adhesion of the plated film is small, and it is possible to retain the thin condition of the second conductive film 28B. In this way, it is possible to form fine second wiring layer 18B formed from the second conductive film 28B.

Furthermore, the shallow via hole 32 is formed as described above even when the via hole 32 is buried by execution of filling plating. Accordingly, it is possible to execute filling plating easily.

Figure 12A:
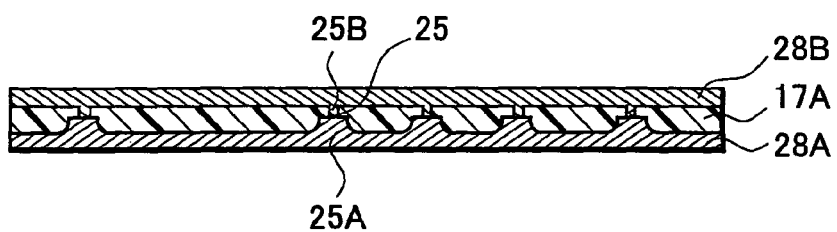
FIGS. 12A to 12C are cross-sectional views showing the method of manufacturing a circuit device of the preferred embodiment of the invention.
Figure 12B:
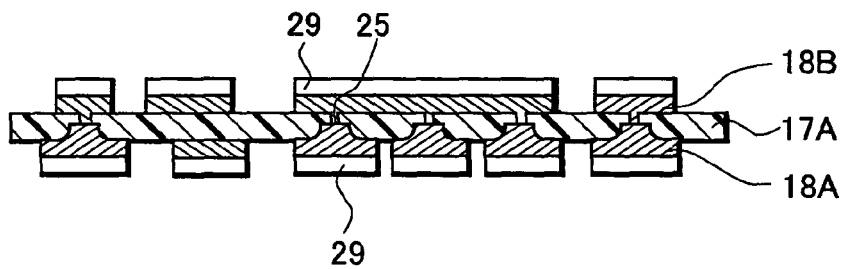

As shown in FIG. 12A, by formation of the second connecting portion 25B, connecting portion 25 including the first connecting portion 25A and the second connecting portion 25B is formed. Moreover, as shown in FIG. 12B, the second wiring layer 18B is formed by performing selective etching with the resist 29. Similarly, the first wiring layer 18A is formed by performing selective etching.

Figure 12C:
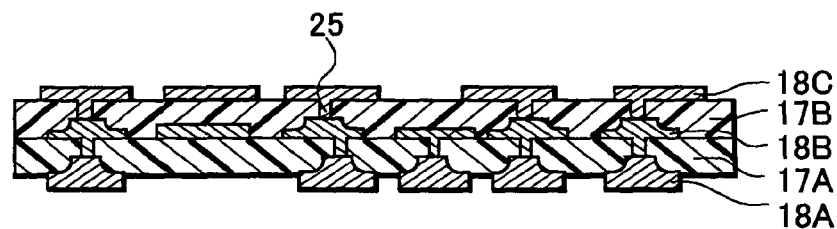

In FIG. 12C, a multilayer wiring structure including three layers of the first wiring layer 18A, the second wiring layer 18B, and third wiring layer 18C is formed. In this case, the connecting portions 25 protruding into convex shapes are formed on both of the upper surface and the lower surface of the second wiring layer 18B.

Figure 13A:
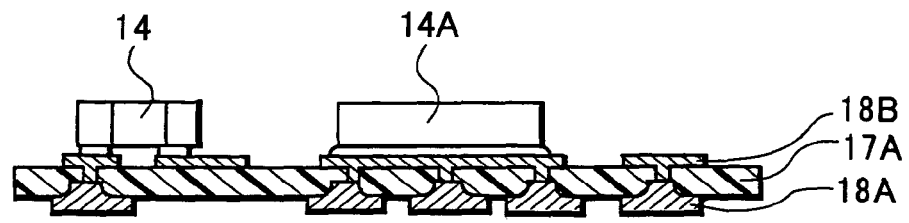
FIGS. 13A to 13C are cross-sectional views showing the method of manufacturing a circuit device of the preferred embodiment of the invention.
Figure 13B:
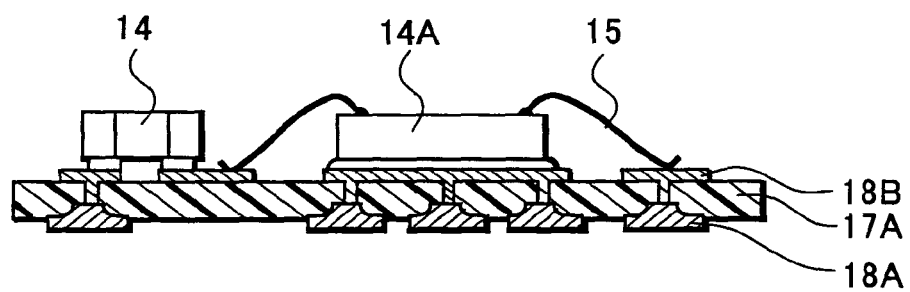
Figure 13C:
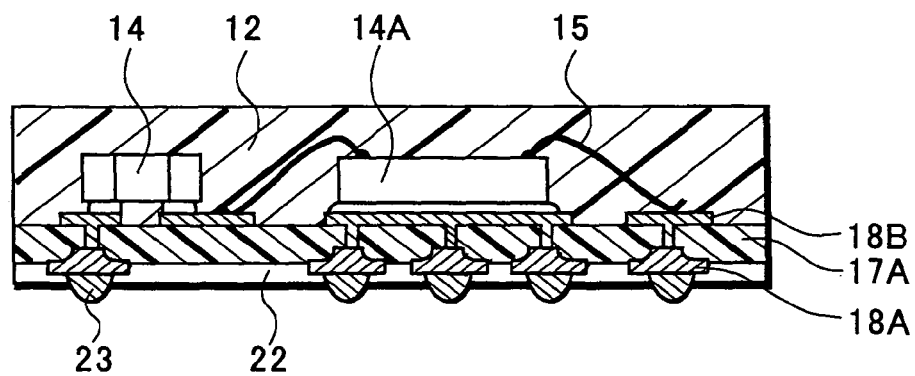

Next, circuit element 14 and semiconductor element 14A are fixed to the second wiring layer 18B (islands) by use of solder or conductive paste as shown in FIG. 13A. Further, as shown in FIG. 13B, an electric circuit is formed by electrically connecting the semiconductor element 14A to the second wiring layer 18B by use of metal thin lines 15. Then, the electric circuit is sealed with sealing resin 12 as shown in FIG. 13C. Subsequently, solder resist 22 is formed so as to cover the first wiring layer 18A, and then external electrodes 23 are formed in predetermined positions. In this way, the circuit device of this embodiment is manufactured.

Next, another method of manufacturing a circuit device will be described with reference to FIGS. 14A to 14D. In the above description, the circuit element 14 was disposed and the sealing resin 12 was formed after patterning the first conductive film 28A and the second conductive film 28B. However, it is also possible to modify the order of these processes. Specifically, it is also possible to pattern only the upper second conductive film 28B in advance, and to pattern the first conductive layer 28A after disposing the circuit element 14 and performing resin sealing. Details of this method will be described below.

Figure 14A:
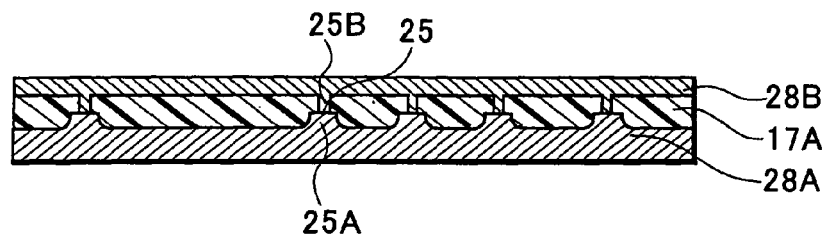
FIGS. 14A to 14D are cross-sectional views showing the method of manufacturing a circuit device of the preferred embodiment of the invention.

Firstly, as shown in FIG. 14A, the first conductive film 28A and the second conductive film 28B are laminated while interposing the first insulating layer 17A. The first conductive film 28A is electrically connected to the second conductive film 28B through the connecting portions 25 formed in predetermined positions. So far, the manufacturing method is the same as the above-described method. Here, the first conductive film 28A is formed into a thick film in order to ensure mechanical strength. To be more precise, the thickness of the first conductive film 28A may be set in a range from several tens of micrometers to about 300 µm. On the contrary, the second conductive film 28B is formed into a thin film in order to form a fine pattern. To be more precise, the thickness of the second conductive film 28B may be set in a range from about 10 µm to 20 µm.

Figure 14B:
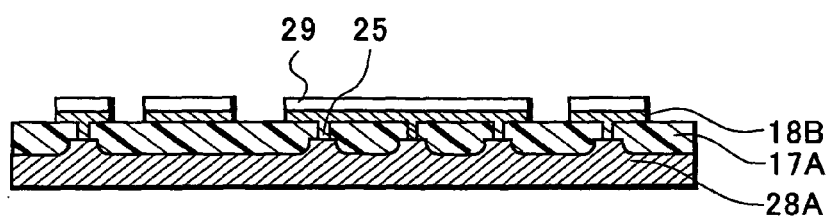

Next, as shown in FIG. 14B, the second wiring layer 18B is formed by patterning the second conductive film 28B. The second wiring layer 18B is formed by etching using the resist 29, which is formed so as to cover the second conductive film 28B selectively.

Figure 14C:
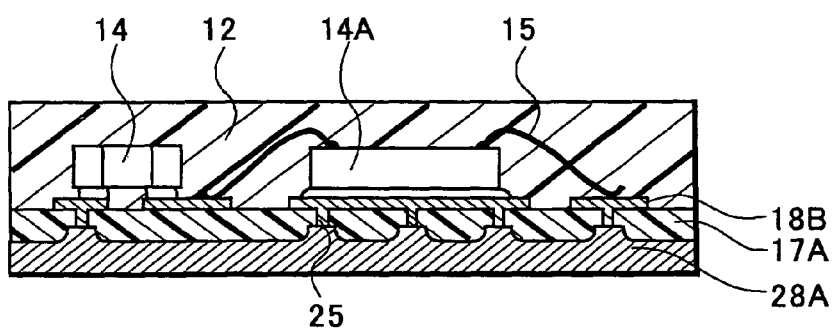

Next, as shown in FIG. 14C, the circuit element 14 and the semiconductor element 14A are electrically connected to the second wiring layer 18B, and then the sealing resin 12 is formed so as to seal the circuit element 14. Since the first conductive film 28A is formed into the sufficiently thick film, it is possible to perform the above-described process while maintaining flatness of the second wiring layer 18B.

Figure 14D:
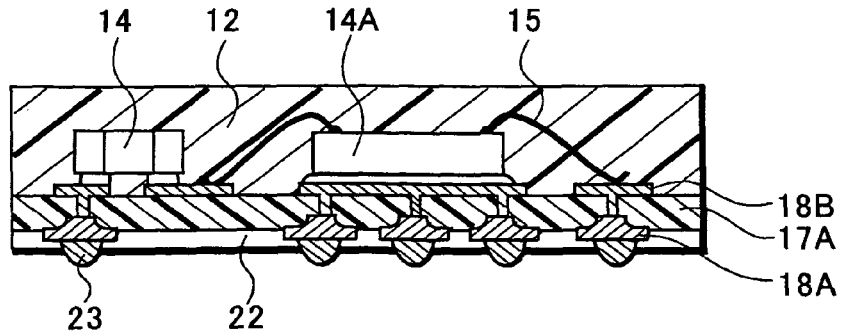
Figure 15:
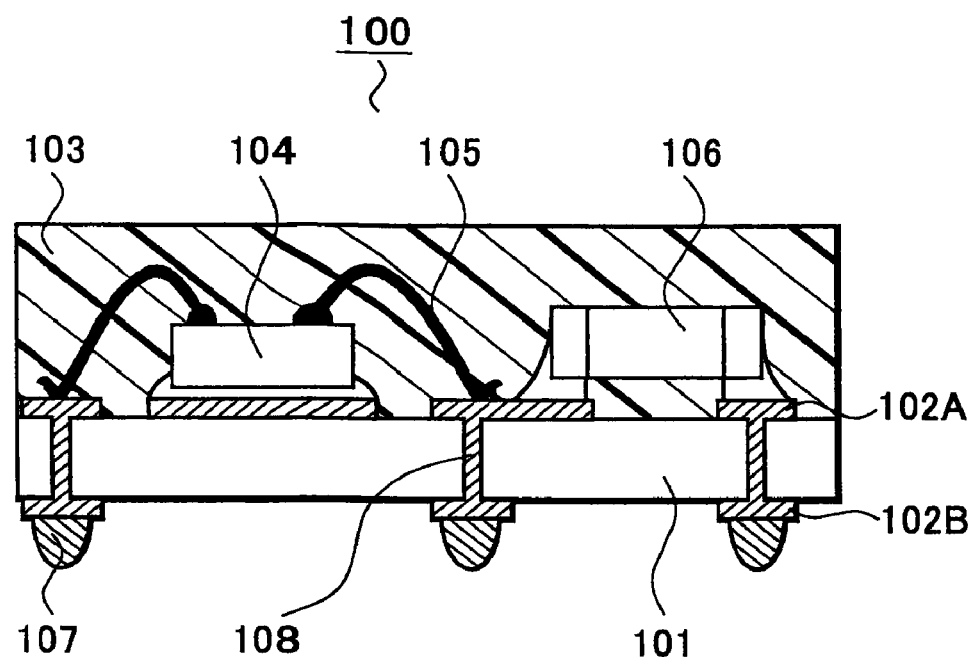
FIG. 15 is a cross-sectional view showing a conventional circuit device.

Next, as shown in FIG. 14D, the first wiring layer 18A is formed by patterning the first conductive film 28A. Further, the circuit device 100 as shown in FIG. 1A, for example, is completed by forming the solder resist 22 and the external electrodes 23.

What is claimed is:

1. A circuit device comprising:
    a substrate and a circuit element mounted on the substrate, the substrate comprising:
    a first wiring layer and a second wiring layer laminated while interposing an insulating layer therebetween, wherein the insulating layer is made of resin containing filler;
    a first connecting portion formed continuously from the first wiring layer and buried in the insulating layer, wherein the first connecting portion protrudes upward;
    a second connecting portion formed continuously from the second wiring layer and buried in the insulating layer, wherein the second connecting portion protrudes downward; and
    wherein the first connecting portion and the second connecting portion contact each other at a position within the insulating layer in a thickness direction of the insulating layer;
    wherein the first wiring layer and the first connecting portion are formed of one piece of metal;
    wherein the first wiring layer is formed on the bottom surface of the insulating layer;
    wherein the second wiring layer is formed on the upper surface of the insulating layer;
    wherein a planar size of the first connecting portion is smaller than the size of the first wiring layer;
    wherein a planar size of the second connecting portion is smaller than the size of the second wiring layer;
    wherein an upper surface of the first wiring layer and the lower surface of the insulating layer are located on a same plane as one another; and
    wherein a lower surface of the second wiring layer and the upper surface of the insulating layer are located on the same plane as one another.

2. The circuit device according to claim 1,
    wherein at least one of the first connecting portion and the second connecting portion is formed of copper foil.

3. The circuit device according to claim 1,
    wherein at least one of the first connecting portion and the second connecting portion is made of a plated film.

4. The circuit device according to claim 1,
    wherein the first connecting portion is formed of copper foil, and the second connecting portion is made of a plated film.

5. The circuit device according to claim 1, comprising
    an external electrode on a rear surface of the first wiring layer.

6. The circuit device according to claim 1,
    wherein planar size of the first connecting portion is larger than the size of the second connecting portion.

7. The circuit device according to claim 1, wherein the first wiring layer comprises a thick portion and a thin portion and the first connecting portion is a part of the thick portion of the first wiring layer.

8. The circuit device according to claim 1, wherein the second wiring layer comprises a thick portion and a thin portion and the second connecting portion is a part of the thick portion of the second wiring layer.

* * * * *